(12) United States Patent
Seidemann et al.

(10) Patent No.: US 12,341,096 B2
(45) Date of Patent: *Jun. 24, 2025

(54) BARE-DIE SMART BRIDGE CONNECTED WITH COPPER PILLARS FOR SYSTEM-IN-PACKAGE APPARATUS

(71) Applicant: Intel Corporation, Santa Clara, CA (US)

(72) Inventors: Georg Seidemann, Landshut (DE); Thomas Wagner, Regelsbach (DE); Andreas Wolter, Regensburg (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/716,958

(22) Filed: Apr. 8, 2022

(65) Prior Publication Data

US 2022/0238440 A1 Jul. 28, 2022

Related U.S. Application Data

(63) Continuation of application No. 17/555,219, filed on Dec. 17, 2021, which is a continuation of application
(Continued)

(51) Int. Cl.
*H01L 23/528* (2006.01)
*H01L 21/56* (2006.01)
(Continued)

(52) U.S. Cl.
CPC ........ *H01L 23/5283* (2013.01); *H01L 21/561* (2013.01); *H01L 21/76885* (2013.01);
(Continued)

(58) Field of Classification Search
CPC ................. H01L 21/561; H01L 21/568; H01L 21/76885; H01L 23/00; H01L 23/3107;
(Continued)

(56) References Cited

U.S. PATENT DOCUMENTS

| 6,900,383 B2 | 5/2005 | Babb |
| 7,402,901 B2 | 7/2008 | Hatano |

(Continued)

FOREIGN PATENT DOCUMENTS

| CN | 103515305 | 1/2014 |
| CN | 105826304 | 8/2016 |

(Continued)

OTHER PUBLICATIONS

Notice of Allowance from Chinese Patent Application No. CN 201680091214.1, mailed Apr. 12, 2023, 4 pgs.
(Continued)

*Primary Examiner* — Mounir S Amer
(74) *Attorney, Agent, or Firm* — Schwabe, Williamson & Wyatt P.C.

(57) ABSTRACT

A system-in-package apparatus includes a semiconductive bridge that uses bare-die pillars to couple with a semiconductive device such as a processor die. The apparatus achieves a thin form factor.

10 Claims, 7 Drawing Sheets

Related U.S. Application Data

No. 16/349,170, filed as application No. PCT/US2016/069176 on Dec. 29, 2016, now Pat. No. 11,270,941.

(51) Int. Cl.

| | |
|---|---|
| *H01L 21/768* | (2006.01) |
| *H01L 23/00* | (2006.01) |
| *H01L 23/31* | (2006.01) |
| *H01L 23/48* | (2006.01) |
| *H01L 23/498* | (2006.01) |
| *H01L 23/532* | (2006.01) |
| *H01L 23/538* | (2006.01) |
| *H01L 25/065* | (2023.01) |
| *H01L 25/16* | (2023.01) |

(52) U.S. Cl.
CPC ............ *H01L 23/00* (2013.01); *H01L 23/481* (2013.01); *H01L 23/53228* (2013.01); *H01L 23/5385* (2013.01); *H01L 24/09* (2013.01); *H01L 24/17* (2013.01); *H01L 25/0652* (2013.01); *H01L 25/0655* (2013.01); *H01L 25/16* (2013.01); *H01L 21/568* (2013.01); *H01L 23/3128* (2013.01); *H01L 23/49811* (2013.01); *H01L 23/49816* (2013.01); *H01L 23/5383* (2013.01); *H01L 23/5384* (2013.01); *H01L 24/96* (2013.01); *H01L 2224/02371* (2013.01); *H01L 2924/15192* (2013.01); *H01L 2924/15311* (2013.01)

(58) Field of Classification Search
CPC ............... H01L 23/3128; H01L 23/481; H01L 23/49811; H01L 23/49816; H01L 23/5283; H01L 23/53228; H01L 23/5381–5385; H01L 24/09; H01L 24/17; H01L 24/19; H01L 24/20; H01L 24/23; H01L 24/96; H01L 25/0652; H01L 25/0655; H01L 25/16; H01L 2224/02371; H01L 2924/15192; H01L 2924/15311
See application file for complete search history.

(56) References Cited

U.S. PATENT DOCUMENTS

| | | | |
|---|---|---|---|
| 8,829,676 B2 * | 9/2014 | Yu | ........................... H01L 24/97 257/737 |
| 9,385,110 B2 | 7/2016 | Yeh | |
| 9,831,195 B1 | 11/2017 | Wen-Long | |
| 2008/0265399 A1 * | 10/2008 | Chao | ................. H01L 23/49827 257/698 |
| 2008/0272486 A1 | 11/2008 | Wang | |
| 2009/0089466 A1 | 4/2009 | Cunningham | |
| 2010/0102428 A1 | 4/2010 | Lee | |
| 2010/0133704 A1 | 6/2010 | Marimuthu | |
| 2011/0068444 A1 | 3/2011 | Chi | |
| 2011/0068459 A1 | 3/2011 | Pagail | |
| 2011/0285005 A1 | 11/2011 | Lin | |
| 2012/0056316 A1 * | 3/2012 | Pagaila | ................... H01L 24/97 257/737 |
| 2012/0292746 A1 | 11/2012 | Lee | |
| 2013/0168854 A1 | 7/2013 | Karikalan | |
| 2014/0084441 A1 | 3/2014 | Chiu et al. | |
| 2014/0159228 A1 | 6/2014 | Teh | |
| 2014/0175636 A1 | 6/2014 | Roy | |
| 2015/0359098 A1 | 12/2015 | Ock | |
| 2015/0371951 A1 * | 12/2015 | Yeh | ..................... H01L 25/0655 257/774 |
| 2016/0071818 A1 | 3/2016 | Wang et al. | |
| 2016/0079169 A1 | 3/2016 | Uzoh | |
| 2016/0085899 A1 | 3/2016 | Qian et al. | |
| 2016/0141234 A1 | 5/2016 | We et al. | |
| 2016/0163566 A1 * | 6/2016 | Chen | ................... H01L 21/4846 257/774 |
| 2016/0204049 A1 | 7/2016 | Chiu et al. | |
| 2016/0218092 A1 | 7/2016 | Chang et al. | |
| 2018/0040548 A1 * | 2/2018 | Kim | ................... H01L 25/0655 |

FOREIGN PATENT DOCUMENTS

| | | | |
|---|---|---|---|
| DE | 102014116417 | 6/2015 | |
| DE | 102014003462 | 9/2015 | |
| EP | 3051585 | 8/2016 | |
| KR | 10-2014-0111716 | 9/2014 | |
| WO | WO-2015130264 A1 * | 9/2015 | ........... H01L 21/486 |
| WO | WO-2018125132 | 7/2018 | |

OTHER PUBLICATIONS

Office Action from Korean Patent Application No. 10-2022-7013303, mailed Oct. 12, 2023, 4 pgs.
International Preliminary Report on Patentability for International Patent Application No. PCT/US2016/069176 mailed Jul. 11, 2019, 12 pages.
International Search Report and Written Opinion for International Application No. PCT/US2016/069176 mailed Oct. 30, 2017, 13 pgs.
Office Action from Korean Patent Application No. 10-2021-7028168, mailed Aug. 10, 2023, 7 pgs.
Office Action from Korean Patent Application No. 10-2019-7015416, mailed Jul. 23, 2023, 10 pgs.
Office Action from U.S. Appl. No. 17/555,219, mailed Feb. 23, 2024, 27 pgs.
Notice of Allowance from Korean Patent Application No. 10-2019-7015416, mailed Mar. 25, 2024, 4 pgs.
Office Action from Korean Patent Application No. 10-2019-7015416, mailed Nov. 21, 2023, 11 pgs.
Notice of Allowance from Korean Patent Application No. 10-2021-7028168, mailed Dec. 27, 2023, 4 pgs.
Office Action from German Patent Application No. 112016007589.8, mailed Nov. 22, 2023, 4 pgs.
Office Action from U.S. Appl. No. 17/555,219, mailed Jul. 17, 2024, 26 pgs.
Office Action from U.S. Appl. No. 17/555,219, mailed Nov. 20, 2024, 13 pgs.
Office Action from Chinese Patent Application No. CN 202111003328.5, mailed Feb. 28, 2025, 7 pgs.
Office Action from Chinese Patent Application No. CN 202210463445.8, mailed Mar. 13, 2025, 10 pgs.
Office Action from German Patent Application No. 112016007575.8, mailed Apr. 4, 2025, 4 pgs.
Office Action from German Patent Application No. 112016007618.5, mailed Apr. 8, 2025, 4 pgs.
Office Action from German Patent Application No. 112016007633.9, mailed Apr. 9, 2025, 5 pgs.

* cited by examiner

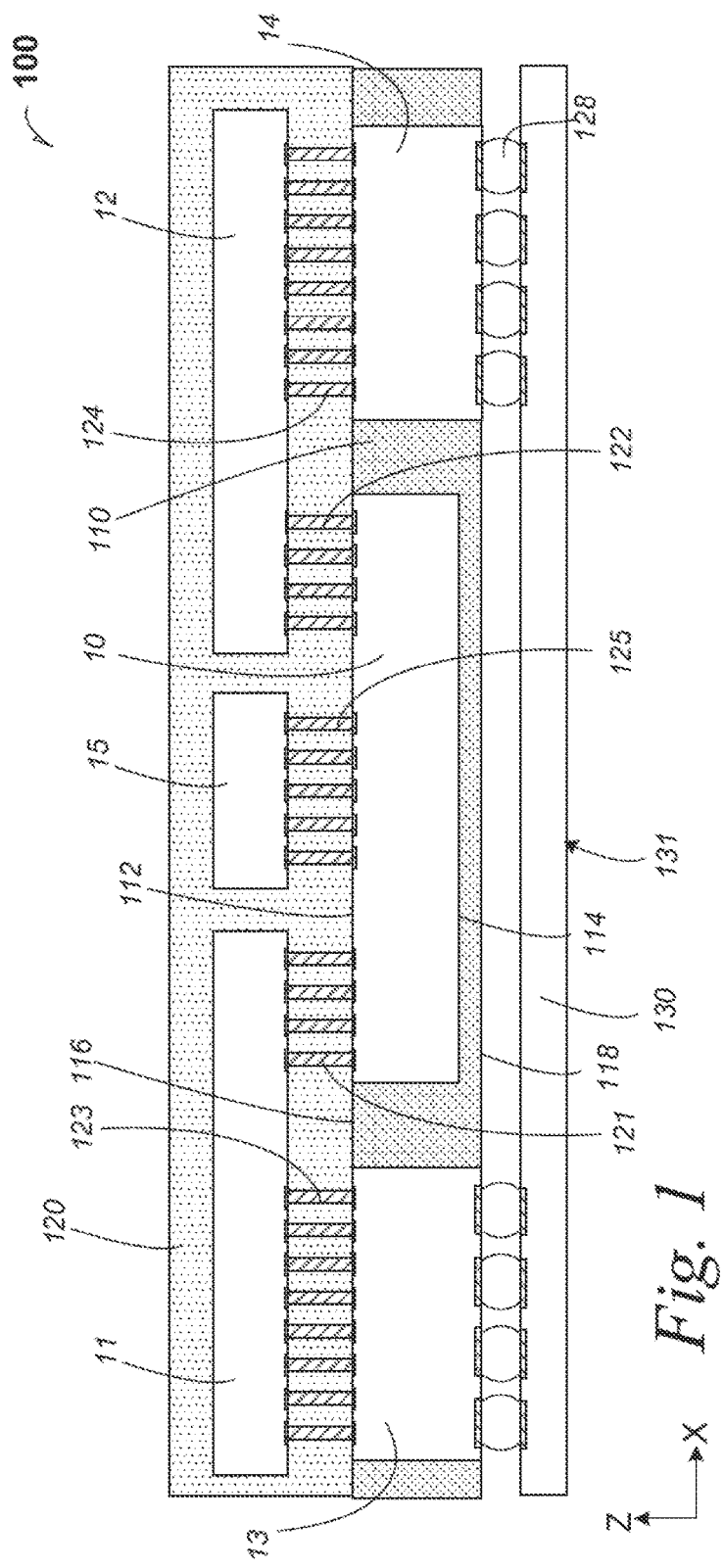
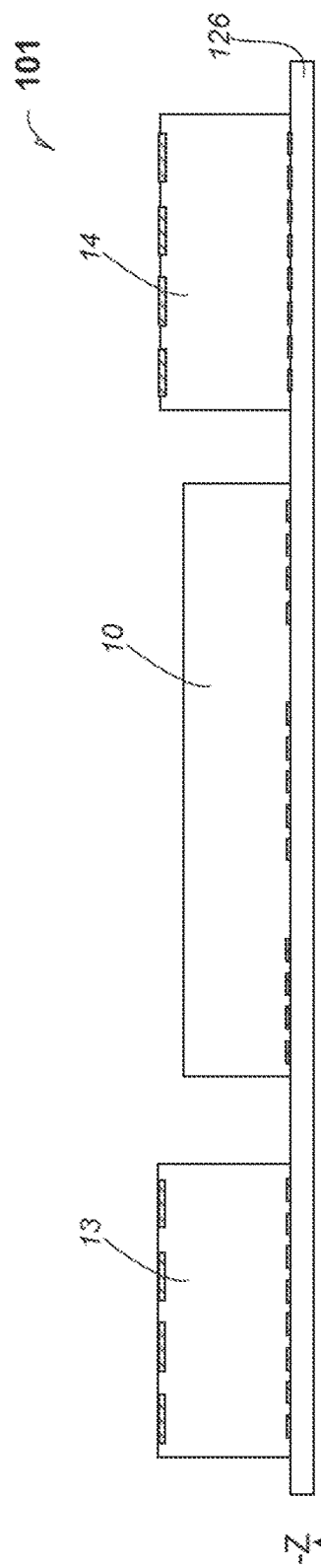
Fig. 1
Fig. 1A

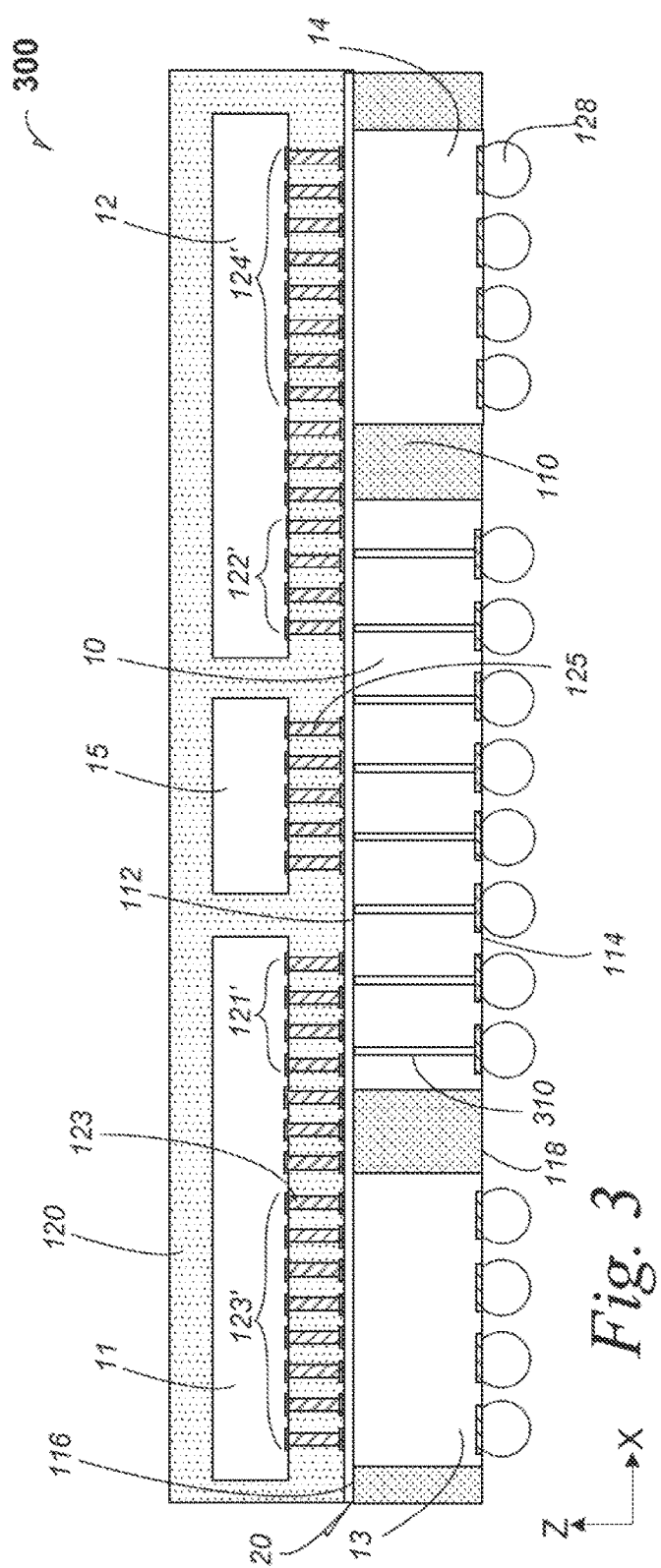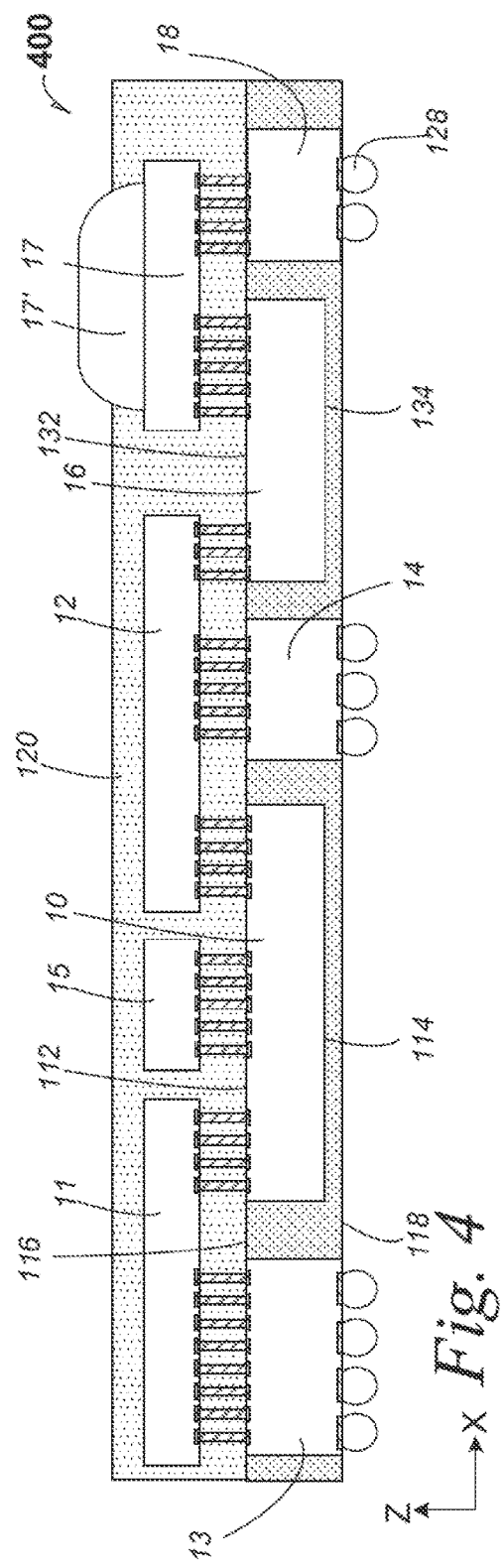

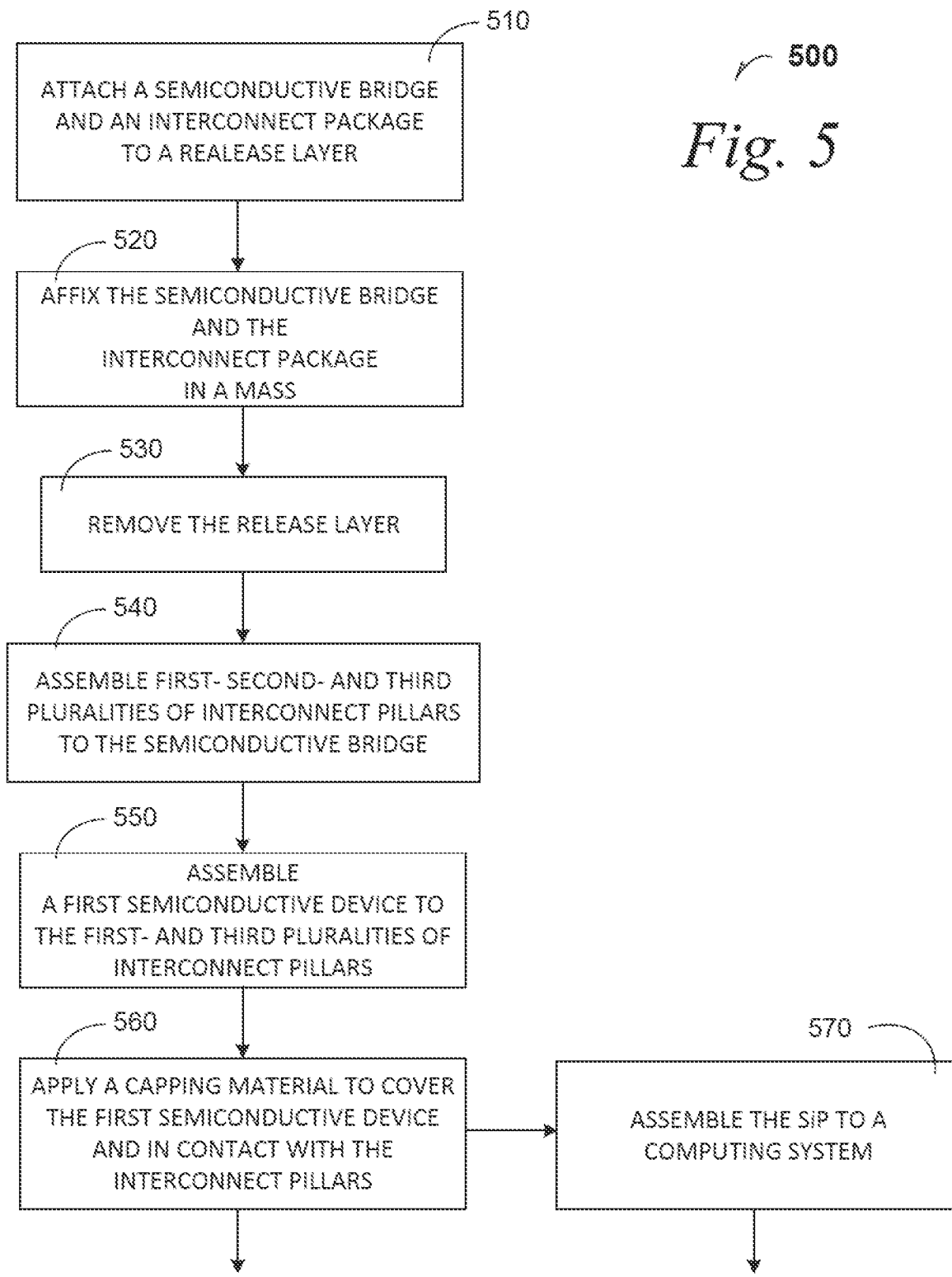

BARE-DIE SMART BRIDGE CONNECTED WITH COPPER PILLARS FOR SYSTEM-IN-PACKAGE APPARATUS

CROSS-REFERENCE TO RELATED APPLICATIONS

This application is a continuation of U.S. patent application Ser. No. 17/555,219, filed Dec. 17, 2021, which is a continuation of U.S. patent application Ser. No. 16/349,170, filed on May 10, 2019, now U.S. Pat. No. 11,270,941, issued Mar. 8, 2022, which is a U.S. National Phase Application under 35 U.S.C. § 371 of International Application No. PCT/US2016/069176, filed Dec. 29, 2016, entitled "BARE-DIE SMART BRIDGE CONNECTED WITH COPPER PILLARS FOR SYSTEM-IN-PACKAGE APPARATUS," which are hereby incorporated by reference in their entirety and for all purposes.

FIELD

This disclosure relates to system-in-package configurations where a bare die semiconductive connector is coupled with copper pillars between two devices.

BACKGROUND

Package miniaturization poses device-integration challenges, where thin-profile apparatus are useful, but interconnections both active and passive devices require physical protection and heat management while miniaturizing the package.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a cross-section elevation of a system-in-package apparatus that includes a semiconductive bridge according to an embodiment;

FIG. 1A is a cross-section elevation of the system-in-package apparatus depicted in FIG. 1 during assembly according to an embodiment;

FIG. 3 is a cross-section elevation of a system-in-package apparatus that includes at least one of a redistribution layer and a semiconductive bridge that includes through-silicon vias according to an embodiment;

FIG. 4 is a cross-section elevation of a system-in-package apparatus that includes a plurality of semiconductive bridges according to an embodiment;

FIG. 5 is a process flow diagram that illustrates assembly of a system-in-package that includes at least one semiconductive bridge that is coupled to interconnect pillars according to an embodiment.

DETAILED DESCRIPTION

Figure 1B:
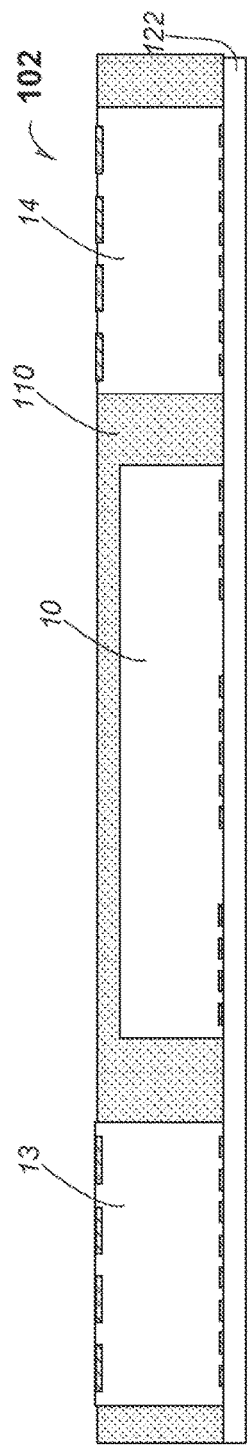
FIG. 1B is a cross-section elevation of the system-in-package apparatus depicted in FIG. 1 after further processing of the structure depicted in FIG. 1A according to an embodiment.

Disclosed embodiments include bare die smart connectors that use a semiconductive bridge that is affixed in a mass such as a molding compound. The smart connector is coupled to interconnect pillars for coupling a semiconductive device such as a processor.

FIG. 1 is a cross-section elevation of a system-in-package apparatus 100 that includes a semiconductive bridge 10 according to an embodiment. The semiconductive bridge 10 may be referred to as a smart die connector 10. The semiconductive bridge 10 may be referred to as a bare die silicon bridge 10.

The semiconductive bridge 10 is affixed in a mass 110 such as an encapsulation material 110. The semiconductive bridge 10 includes an active surface 112 and a backside surface 114. The mass 110 includes a die side 116 and a land side 118. In an embodiment, the backside surface 114 is fully enclosed in the mass 110.

In an embodiment, the mass 110 is a molding compound that is useful for encapsulating semiconductive devices such as the semiconductive bridge 10. In an embodiment, the mass 110 is a molding compound such as a thermally cured resin material that is useful for encapsulating semiconductive devices such as the semiconductive bridge 10.

The system-in-package (SiP) apparatus 100 also includes an interconnect package 13 that is also affixed in the mass 110. In an embodiment, the interconnect package 13 is a laminated structure 13 that provides interconnect- and trace interconnection (as illustrated in FIG. 2D) between the die side 116 and the land side 118. In an embodiment, the interconnect package 13 is a through-package via structure 13 that includes via bars (as illustrated in FIG. 2C) that pass straight through the interconnect package 13 between the die side 116 and the land side 118. In an embodiment, the interconnect package 13 is made from organic materials such as FR4 construction. In an embodiment, the interconnect package 13 is made from semiconductive materials. In an embodiment, the interconnect package 13 is made from inorganic materials such as a glass construction.

In an embodiment, a semiconductive device 11 such as a processor logic die 11 is affixed in a capping material 120 such as a mold cap 120. In an embodiment, the capping material 120 is an optically cured resin. In an embodiment, the capping material is a thermally cured resin of a different quality from the mass 110. The semiconductive device 11 may also be referred to as an integrated circuit (IC) die 11. In an embodiment, the processor logic die 11 is a processor manufactured by Intel Corporation of Santa Clara, Calif.

Electronic communication by the semiconductive device 11 with the semiconductive bridge 10 is facilitated by a first plurality of interconnect pillars, one of which is indicated by reference numeral 121. The semiconductive device 11 is also coupled to the interconnect package 13 by a third plurality of interconnect pillars, one of which is indicated by the reference numeral 123.

In an embodiment, the semiconductive device 11 is a first semiconductive device 11, and a second semiconductive device 12 such as a memory die 12 is affixed in the capping material 120. In an embodiment, the second semiconductive device 12 is a memory die manufactured by IM Flash technologies of Lehi, Utah. In a memory-die embodiment, the second semiconductive device 12 may also be referred to as an IC memory die 12. Electronic communication by the second semiconductor device 12 with the semiconductive bridge 10 is facilitated by a second plurality of interconnect pillars, one of which is indicated by reference numeral 122.

In an embodiment, the interconnect package 13 is a first interconnect package 13 and a second interconnect package 14 is also affixed in the mass 110. In an embodiment, the second interconnect package 14 is a laminated structure 14 that provides interconnect-and-trace interconnection between the die side 116 and the land side 118. In an embodiment, the second interconnect package 14 is a through-package via structure 14 that includes via bars between the die side 116 and the land side 118.

In an embodiment, the SiP apparatus 100 includes a passive component 15 such as a diode 15. In an embodiment, the passive component 15 is a balun 15 and the second semiconductive device 12 is a baseband processor that is assisted by the balun 15. Electronic communication by passive component 15 with the semiconductive bridge 10 is facilitated by a fifth plurality of interconnect pillars, one of which is indicated by reference numeral 125.

A capping material 120 is provided to cover the devices that are coupled to the semiconductive bridge 10. In an embodiment, the capping material is a mold cap compound.

FIG. 1A is a cross-section elevation 101 of the SiP apparatus 100 depicted in FIG. 1 during assembly according to an embodiment. Cartesian references are given in −Z and X as the structure depicted in FIG. 1A will be vertically inverted after further processing. A release layer 126 is provided, to which the semiconductive bridge 10 is mounted in a flipped configuration to the release layer 126. Additionally, the first interconnect package 13 is also positioned on the release layer 126 in an embodiment. Additionally, the second interconnect package 14 is also positioned on the release layer 126 in an embodiment.

FIG. 1B is a cross-section elevation 102 of the SiP apparatus 100 depicted in FIG. 1 after further processing of the structure depicted in FIG. 1A according to an embodiment. A mass 110 has been applied to the semiconductive bridge 10, the first- and second interconnect packages 13 and 14, respectively, as well as to the release layer 126. By this process, the articles 10, 13 and 14 are affixed and are ready to be inverted for further processing.

Figure 1C:
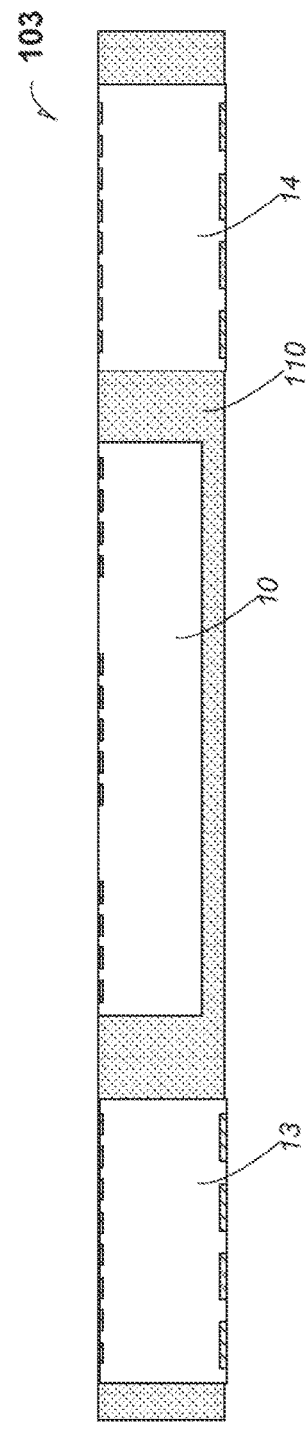
FIG. 1C is a cross-section elevation of the system-in-package apparatus depicted in FIG. 1 after further process of the structure depicted in FIG. 1B according to an embodiment.

FIG. 1C is a cross-section elevation 103 of the SiP apparatus 100 depicted in FIG. 1 after further process of the structure depicted in FIG. 1B according to an embodiment. Cartesian references are given in Z and X as the structure depicted in FIG. 1B has been vertically inverted. The release layer 126, depicted in FIG. 1B, has been removed. It can be seen that bond pads are illustrated, which are useful for describing bonding locations both for interconnect pillars as well as electrical bumps.

Figure 1D:
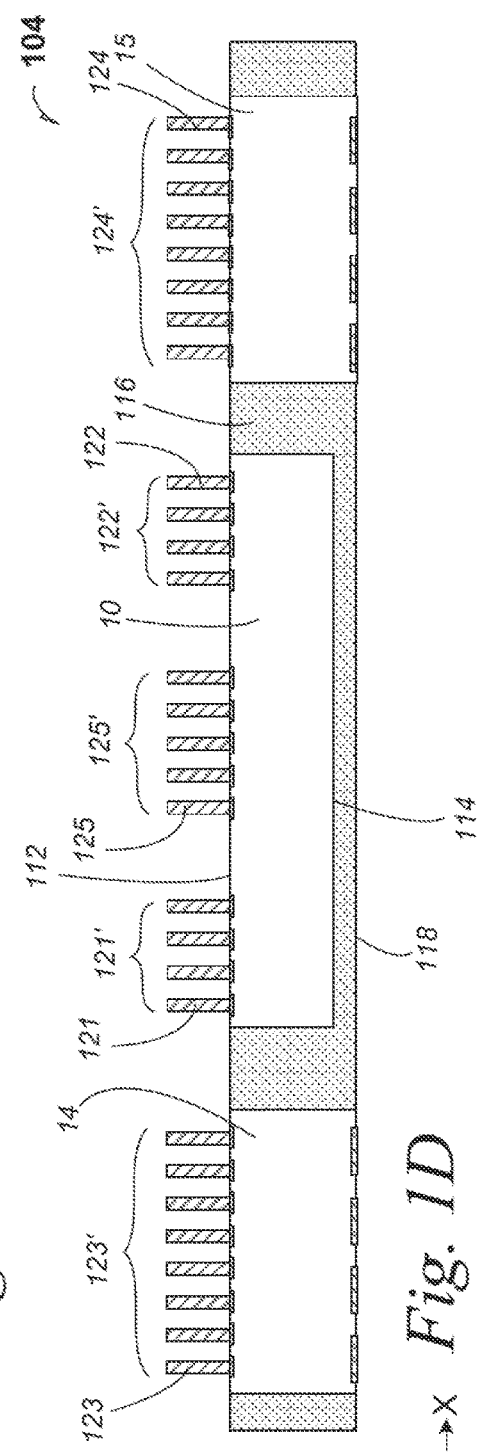
FIG. 1D is a cross-section elevation of the system-in-package apparatus depicted in FIG. 1 after further process of the structure depicted in FIG. 1C according to an embodiment.

FIG. 1D is a cross-section elevation 104 of the SiP apparatus 100 depicted in FIG. 1 after further process of the structure depicted in FIG. 1C according to an embodiment. Placement of the first plurality of interconnect pillars 121 is accomplished by growing the pillars 121 in situ upon the plurality of bond pads that are depicted within the footprint 121' according to an embodiment. For example, electrolytic deposition of a copper-containing material may be accomplished by growing the interconnect pillars 121 through a mask (not illustrated). In an embodiment, electroless deposition of a primer layer upon a given bond pad is done, such as a precious metal film, e.g., gold, followed by electrolytic deposition of interconnect-grade copper. Placement of the second plurality of interconnect pillars 122 is accomplished by growing the pillars 122 in situ upon the plurality of bond pads that are depicted within the footprint 122' according to an embodiment. Placement of the third plurality of interconnect pillars 123 is accomplished by growing the pillars 123 in situ upon the plurality of bond pads that are depicted within the footprint 123' according to an embodiment. Placement of the fourth plurality of interconnect pillars 124 is accomplished by growing the pillars 124 in situ upon the plurality of bond pads that are depicted within the footprint 124' according to an embodiment. Placement of the fifth plurality of interconnect pillars 125 is accomplished by growing the pillars 125 in situ upon the plurality of bond pads that are depicted within the footprint 125' according to an embodiment. It is now understandable that each of the interconnect pillar sets may be grown individually, or a subset of the depicted pillars may be established, depending upon a given useful application needed. In an embodiment, all of the depicted pillars are grown in situ simultaneously.

Reference is again made to FIG. 1. After processing depicted in any of the previous figures, an electrical bump array is formed on the interconnect packages, one landside bump of which is enumerated with reference numeral 128. In an embodiment, a board 130 is assembled to the electrical bump array 128. In particular, the electrical bump array 128 may be referred to as a landside bump array 128.

Useful applications of SiP embodiments that contain the semiconductive bridge 10 include a lowered Z-height due to interconnect pillar length such as in a range between about 10 micrometer (micron) and 50 micron. Useful applications of SiP embodiments that contain the semiconductive bridge 10 include a lowered Z-height due to the semiconductive bridge 10 being located at approximately the same Z-location of the interconnect package 13, and the material qualities of the mass 110 being sufficiently stiff as to preclude the use of a core material.

In an embodiment, the semiconductive bridge 10 is referred to as a smart bridge 10 where back-end-of-line (BEOL) metallization connects logic in the smart bridge 10 between the first IC device 11 and the second an IC device 12. In an embodiment, the smart bridge 10 includes BEOL metallization that connects microcontroller logic in the smart bridge 10 between the first IC device 11 and the second an IC device 12. In an embodiment, the smart bridge 10 includes BEOL metallization that connects external sensor logic in the smart bridge 10 between the first IC device 11 and the second an IC device 12. In an embodiment, the smart bridge 10 includes BEOL metallization that connects memory controller logic, with no memory functionality in the smart bridge 10, but the memory controller logic affects communication between the first IC device 11 and a memory IC device 12. In an embodiment, the smart bridge 10 includes BEOL metallization that contains switching logic such as for power-conservation functionality or such as temperature-control functionality between the first IC device 11 and the second IC device 12.

Figure 2:
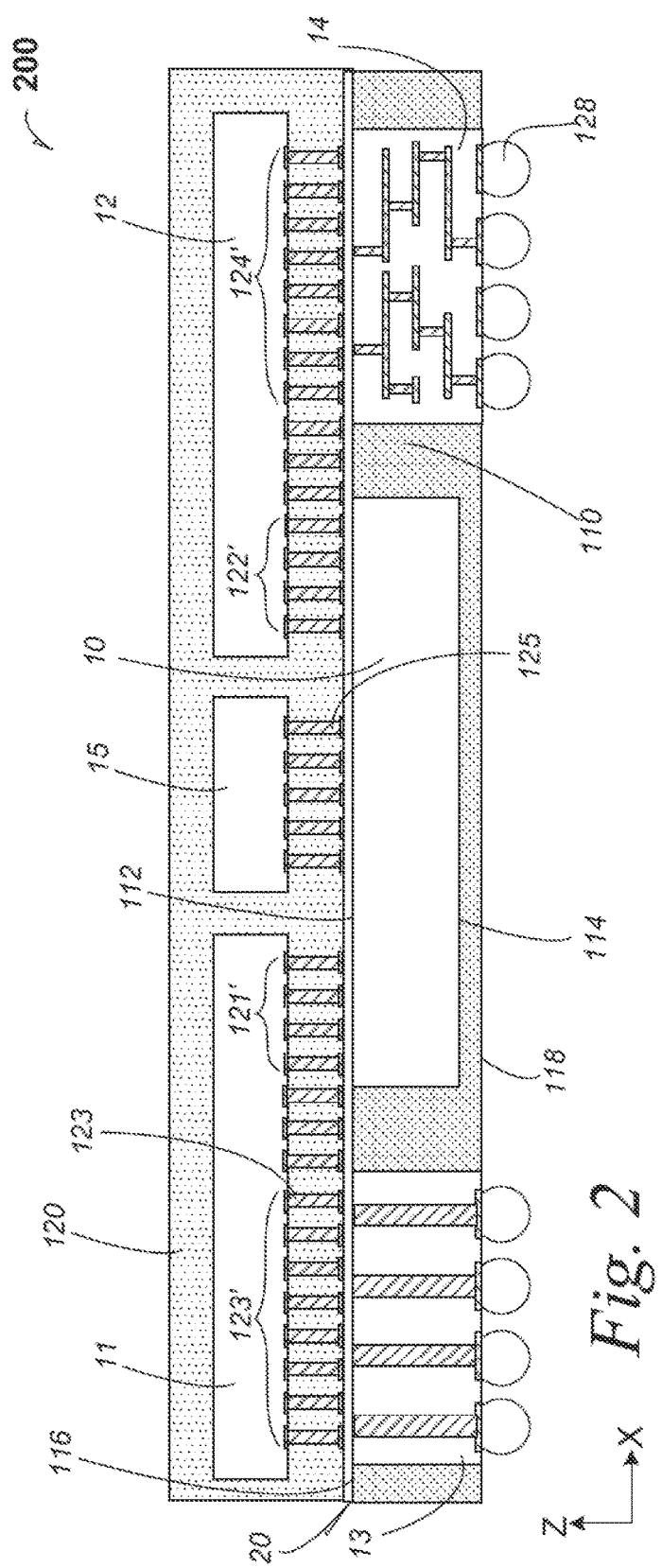
FIG. 2 is a cross-section elevation of a system-in-package apparatus that includes a redistribution layer and at least a semiconductive bridge and a first integrated circuit die according to an embodiment.
Figure 2C:
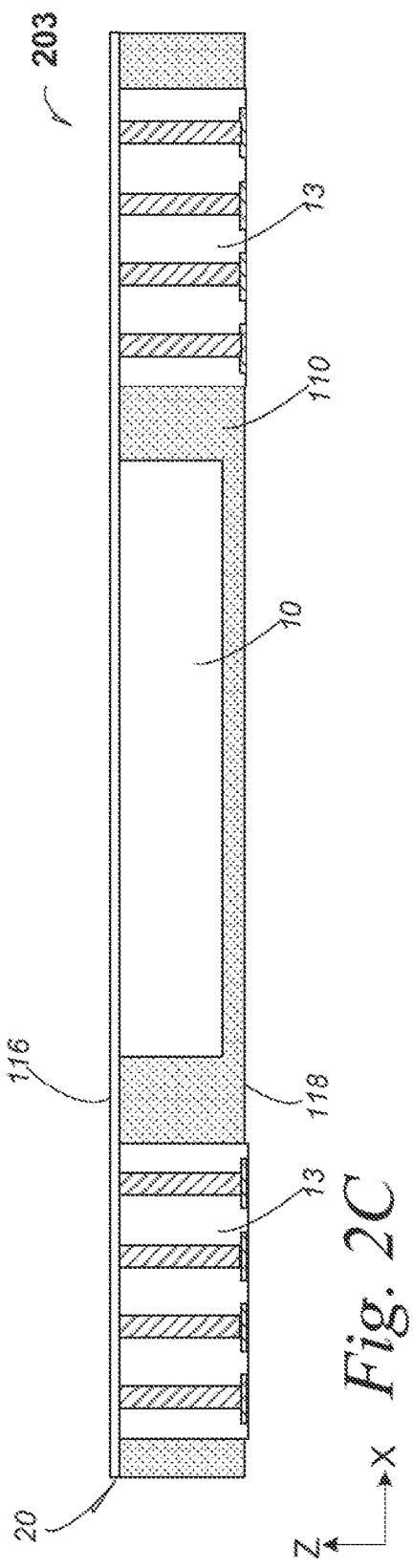
FIG. 2C is a cross-section elevation of the system-in-package apparatus depicted in FIG. 2 after further process of the structure depicted, for example in FIGS. 1A and 1B according to an embodiment.
Figure 2D:
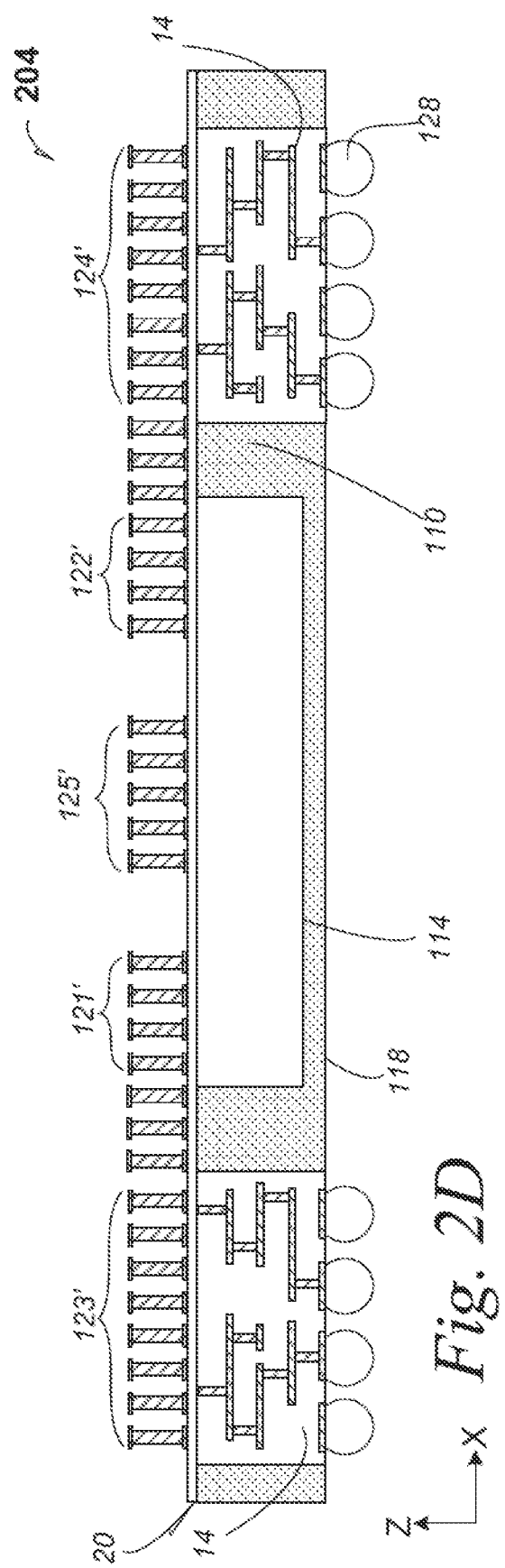
FIG. 2D is a cross-section elevation of the system-in-package apparatus depicted in FIG. 2 after further process of the structure depicted in FIG. 2C according to an embodiment.

FIG. 2 is a cross-section elevation of a system-in-package apparatus 200 that includes a redistribution layer 20 and at least a semiconductive bridge 10 and a first IC die 11 according to an embodiment. The redistribution layer (RDL) 20 is useful where, in an example embodiment, increased pin count is desired, particularly in regions between e.g., the semiconductive bridge 10 and a given interconnect package 13. For example, the RDL 20 expands design freedom as the interconnect pillars are not necessarily tied to a give pad position on the semiconductive bridge 10, nor to a given pad position of a given interconnect package, or both. In a non-limiting illustrative embodiment, it can be seen that first- and third interconnect pillar footprints 121' and 123' respectively have a number of interconnect pillars there (three are illustrated by non-limiting example) between that connect from the first IC die 11 to the RDL 20 and for illustrative purposes, and not by necessity, but the three illustrated interconnect pillars are not directly above either of the semiconductive bridge 10 nor the first interconnect package 13. Similarly, in a non-limiting illustrative embodiment, it can be seen that second- and fourth interconnect pillar footprints 122' and 124' respectively have a number of interconnect pillars there between that connect from the second IC die 12 to the RDL 20. It should be understood that the RDL 20 does not necessarily provide a direct Z-direction contact between any interconnect pillar and e.g. a device directly underlying the interconnect pillar, although such a direct Z-direction contact is not excluded.

FIG. 2C is a cross-section elevation 203 of the SiP apparatus 200 depicted in FIG. 2 after further process of the structure depicted, for example in FIGS. 1A and 1B according to an embodiment. Items 2A and 2B are not used. The release layer 126, depicted in FIG. 1B, has been removed. It can be seen that bond pads in interconnect packages 13 and 14 are illustrated substantially flush with the land side 118, but the RDL 20 precludes explicit illustration of bond pads for the semiconductive bridge 10 and the interconnect packages 13 and 14 where the semiconductive bridge 10 and the packages 13 and 14 are substantially flush with the die side 116 of the mass 110.

FIG. 2D is a cross-section elevation 204 of the SiP apparatus 200 depicted in FIG. 2 after further process of the structure depicted in FIG. 2C according to an embodiment. Placement of the several pluralities of interconnect pillars 121, 122, 123, 124, and 125 is accomplished by any technique disclosed herein for the embodiments depicted in FIG. 1D. It can be seen that more interconnect pillars are depicted than just those categorized within the footprints 121', 122', 123', 124' and 125' in order to accommodate a higher pin count in an embodiment. In an embodiment, the pin count may be higher or lower, but placement of the several interconnect pillars may be altered to facilitate the RDL 20.

It may now be understood that a via-pillar interconnect package 13 may be used as one- or both of the interconnect packages in any given embodiment. It may now be understood that a via-trace interconnect package 14 may be used as one- or both of the interconnect packages in any given embodiment. It may now be understood that a combination of via-pillar interconnect package 13 and a via-trace interconnect package 14 may be used together in any given embodiment.

FIG. 3 is a cross-section elevation of a system-in-package apparatus 300 that includes at least one of a redistribution layer 20 and a semiconductive bridge 10 that includes through-silicon vias (TSVs), one of which is illustrated with the numeral 310 according to an embodiment. It can be seen that Z-direction geometries have been altered to allow the backside 114 of the semiconductive bridge 10 to be substantially flush with the land side 118 of the mass 110. This configuration allows for TSVs 310 to be bumped at the level of the landside bump array 128.

In an embodiment, the SiP 300 may be configured without the RDL 20 (restricting the interconnect pillars to the enumerated footprints), and the semiconductive bridge 10 provides TSV communication to the land side 118. In embodiment without an RDL, no interconnect package (13 nor 14) is used such that all communication to the land side 118 is through the TSVs 310. In embodiment without an RDL, no interconnect package (13 nor 14) is used such that all communication to the land side 118 is through the TSVs 310. In embodiment without an RDL, only one interconnect package (e.g. package 13) is used such that all communication to the land side 118 is in part through the interconnect package 13 and in part through the TSVs 310.

In an embodiment including the RDL 20, no interconnect package (13 nor 14) is used such that all communication to the land side 118 is through the TSVs 310. In embodiment including the RDL 20, only one interconnect package (e.g. package 13) is used such that all communication to the land side 118 is in part through the interconnect package 13 and in part through the TSVs 310.

FIG. 4 is a cross-section elevation of a system-in-package apparatus 400 that includes a plurality of semiconductive bridges 10 and 16 according to an embodiment. Similarities are seen in the SiP apparatus 400 to previously disclosed embodiments. In an embodiment, the semiconductive bridge 10 is a first semiconductive bridge 10 and the semiconductive bridge 16 is a subsequent semiconductive bridge 16. The subsequent semiconductive bridge 16 includes an active surface 132 and a backside surface 134. Where only two semiconductive bridges are present, the subsequent semiconductive bridge 16 may be referred to as a second semiconductive bridge 16.

It can be seen that several interconnect pillars couple devices as well as interconnect packages 13, 14, and 18 such that electronic communication may be continuous from the IC die 11 to an external device 17 through the several series of interconnect pillars. In an embodiment, the external device 17 is a camera with a lens 17'. In an embodiment, the external device 17 includes a touch-sensitive display screen 17'. In an embodiment, the external device 17 includes a user interface 17'.

Whereas the SiP apparatus 400 is illustrated as a bare-die semiconductive bridge-coupled apparatus, it is understood that an RDL may be used between the series of interconnect pillars and the die side 116 of the mass 110 as is illustrated in other disclosed embodiments.

FIG. 5 is a process flow diagram 500 that illustrates assembly of an SiP that includes at least one semiconductive bridge that is coupled to interconnect pillars according to an embodiment.

At 510, the process includes attaching a semiconductive bridge and an interconnect package to a release layer.

At 520, the process includes affixing the semiconductive bridge and the interconnect package in a mass.

At 530, the process includes removing the release layer.

At 540, the process includes assembling first- second- and third pluralities of interconnect pillars to the semiconductive bridge.

At 550, the process includes assembling a first semiconductive device to the first- and third pluralities of interconnect pillars.

At 560, the process includes applying a capping material to cover the first semiconductive device and in contact with the interconnect pillars.

At 570, the process includes assembling the SiP, that includes a smart bridge, to a computing system.

Figure 6:
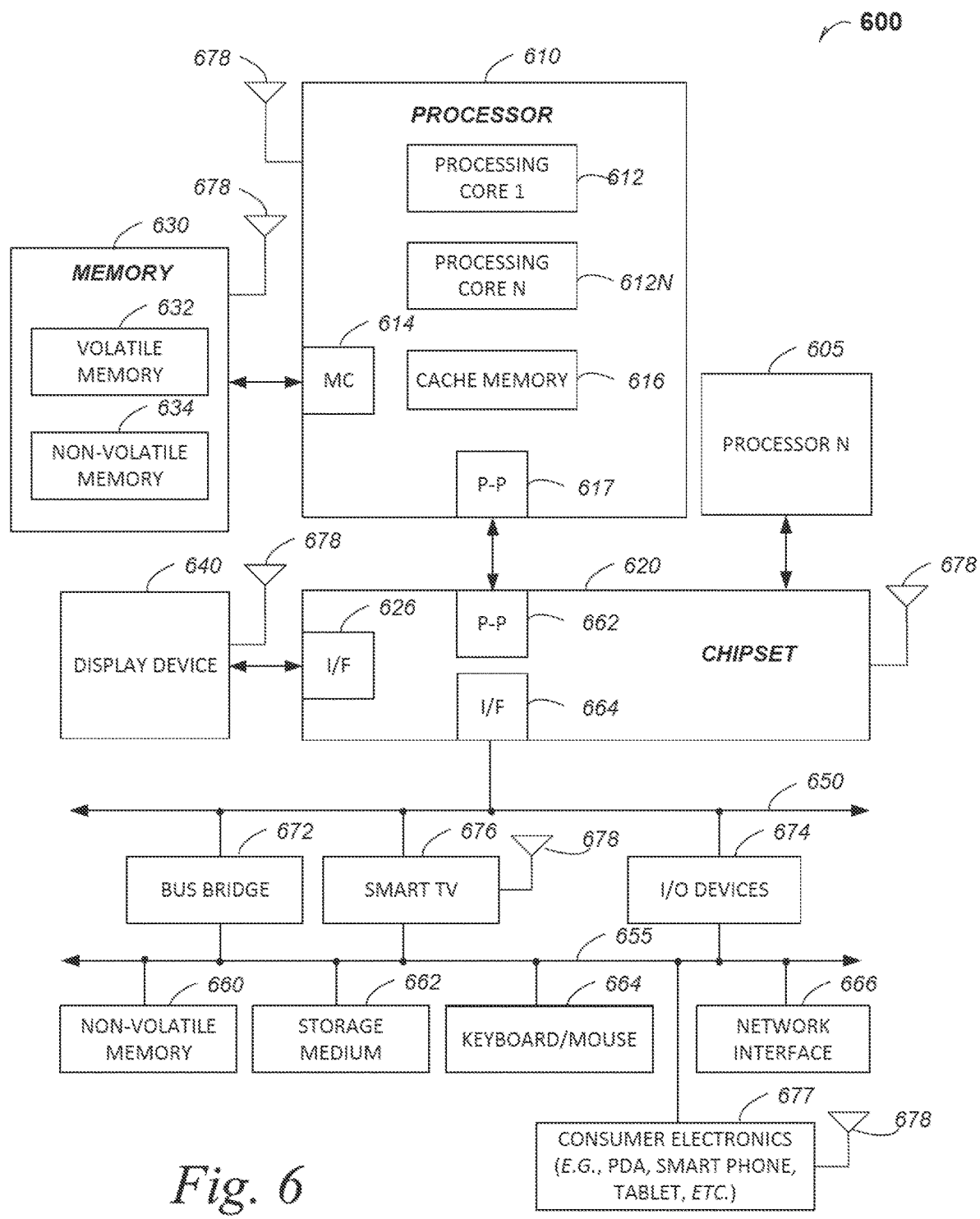
FIG. 6 is included to show an example of higher level device applications for the disclosed embodiments.

FIG. 6 is included to show an example of a higher level device application for the disclosed embodiments. In an embodiment, a computing system 600 includes, but is not limited to, a desktop computer. In an embodiment, a system 600 includes, but is not limited to a laptop computer. In an embodiment, a system 600 includes, but is not limited to a netbook. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing device may be configured with the microelectronic device that includes a system-in-package apparatus with a semiconductive bridge embodiment.

In some embodiments, the system-in-package apparatus with a semiconductive bridge embodiment 600 includes a system on a chip (SOC) system.

In an embodiment, the processor 610 has one or more processing cores 612 and 612N, where 612N represents the Nth processor core inside processor 610 where N is a positive integer. In an embodiment, the electronic device system 600 using a system-in-package apparatus with a semiconductive bridge embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the SiP device system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a system-in-package apparatus with a semiconductive bridge embodiment as set forth in this disclosure. The chipset 620 enables the processor 610 to connect to other elements in the SiP device system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In and embodiment, the processor 610 and the chipset 620 are merged into a single SOC. Additionally, the chipset 620 connects to one or more buses 650 and 655 that interconnect various elements 674, 660, 662, 664, and 666. Buses 650 and 655 may be interconnected together via a bus bridge 672. In an embodiment, the chipset 620 couples with a non-volatile memory 660, a mass storage device(s) 662, a keyboard/mouse 664, and a network interface 666 by way of at least one of the interface 624 and 674, the smart TV 676, and the consumer electronics 677, etc.

In and embodiment, the mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the SiP apparatus in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

Where useful, the computing system 600 may have an outer shell that is part of the several land side board embodiments that would be attached at the bump array 128 described in this disclosure. In FIG. 1, a board 130 is coupled to the electrical bump array 128. In an embodiment, an outer shell 131 is an electrically insulated structure on the board 130 that also provides physical protection for the SiP apparatus 100.

It may now be understood that a board 130 embodiment may be applied to each illustrated and described electrical bump array 128.

To illustrate the memory-die stacked memory module in a system in package apparatus embodiments and methods disclosed herein, a non-limiting list of examples is provided herein:

Example 1 is a system-in-package apparatus comprising: a semiconductive bridge fixed in a mass, the semiconductive bridge including an active surface and a backside surface, and the mass including a die side and a land side; first- and second pluralities of interconnect pillars extending from the active surface; an interconnect package fixed in the mass, wherein the interconnect package communicates from the die side to the land side; a third plurality of interconnect pillars disposed on the interconnect package at the die side; a first semiconductive die coupled to the first- and third pluralities of interconnect pillars; a second semiconductive die coupled to the second plurality of interconnect pillars; and wherein the first and second semiconductive dice are affixed in a capping material, and wherein the capping material contacts the first- second- and third pluralities of interconnect pillars.

In Example 2, the subject matter of Example 1 optionally includes wherein the interconnect package is a first interconnect package, further including: a second interconnect package fixed in the mass, wherein the second interconnect package communicates from the die side to the land side; a fourth plurality of interconnect pillars disposed on the second interconnect package at the die side, wherein the second- and fourth pluralities of interconnect pillars are coupled to the second semiconductive die, and wherein the capping material contacts the fourth plurality of interconnect pillars.

In Example 3, the subject matter of any one or more of Examples 1-2 optionally include a passive device coupled to the semiconductive bridge at a fifth plurality of interconnect pillars that are disposed between the first- and second pluralities of interconnect pillars.

In Example 4, the subject matter of any one or more of Examples 1-3 optionally include wherein the interconnect package is a first interconnect package, further including: a second interconnect package fixed in the mass, wherein the second interconnect package communicates from the die side to the land side; a fourth plurality of interconnect pillars disposed on the second interconnect package at the die side, wherein the second- and fourth pluralities of interconnect pillars are coupled to the second semiconductive die, and wherein the capping material contacts the fourth plurality of interconnect pillars; wherein the first semiconductive device is a processor device, and wherein the second semiconductive die is a memory device.

In Example 5, the subject matter of any one or more of Examples 1~4 optionally include an electrical bump array disposed on the land side and coupled to the interconnect package.

In Example 6, the subject matter of any one or more of Examples 1-5 optionally include a redistribution layer that abuts the several pluralities of interconnect pillars, and wherein the redistribution layer contacts the semiconductive bridge and the interconnect package at a level of the active surface and the die side.

In Example 7, the subject matter of Example 6 optionally includes wherein the interconnect package is a first interconnect package, further including: a second interconnect package fixed in the mass, wherein the second interconnect package communicates from the die side to the land side; a fourth plurality of interconnect pillars disposed on the second interconnect package at the redistribution layer above the die side, wherein the second- and fourth pluralities of interconnect pillars are coupled to the second semiconductive die through the redistribution layer, and wherein the capping material contacts the fourth plurality of interconnect pillars and the redistribution layer.

In Example 8, the subject matter of any one or more of Examples 6-7 optionally include a passive device coupled to the redistribution layer by a fifth plurality of interconnect pillars disposed between the first- and second pluralities of interconnect pillars.

In Example 9, the subject matter of Example 8 optionally includes wherein the passive device is a diode.

In Example 10, the subject matter of any one or more of Examples 1-9 optionally include wherein the backside surface is fully enclosed in the mass.

In Example 11, the subject matter of any one or more of Examples 1-10 optionally include wherein the semiconductive bridge includes a through-silicon via, and wherein the backside surface emerges from the mass, further including: an electrical bump array disposed on the land side and coupled to the interconnect package; and wherein the electrical bump array includes an electrical bump on the semiconductive bridge at the backside surface, wherein the through-silicon via is coupled to the electrical bump.

In Example 12, the subject matter of Example 11 optionally includes wherein the interconnect package is a first interconnect package, further including: a second interconnect package fixed in the mass, wherein the second interconnect package communicates from the die side to the land side; a fourth plurality of interconnect pillars disposed on the second interconnect package at the die side, wherein the second- and fourth pluralities of interconnect pillars are coupled to the second semiconductive die, and wherein the capping material contacts the fourth plurality of interconnect pillars.

In Example 13, the subject matter of Example 12 optionally includes a passive device coupled to the semiconductive bridge at a fifth plurality of interconnect pillars that are disposed between the first- and second pluralities of interconnect pillars.

In Example 14, the subject matter of any one or more of Examples 1-13 optionally include an electrical bump array assembled to the interconnect package; and a board assembled to the electrical bump array.

In Example 15, the subject matter of any one or more of Examples 1-14 optionally include wherein the interconnect package is an interconnect-and-trace connection between the die side and the land side of the mass.

In Example 16, the subject matter of any one or more of Examples 1-15 optionally include wherein the interconnect package is a through-package via structure connection between the die side and the land side of the mass.

In Example 17, the subject matter of any one or more of Examples 1-16 optionally include wherein the mass is a thermally cured resin and wherein the capping material is an optically cured resin.

Example 18 is a system-in-package apparatus comprising: a semiconductive bridge including an active surface and a backside surface; first- and second pluralities of interconnect pillars extending from the active surface; an interconnect package including a die side and a land side, wherein the interconnect package communicates from the die side to the land side; a third plurality of interconnect pillars disposed on the interconnect package at the die side; a first semiconductive die coupled to the first- and third pluralities of interconnect pillars; a second semiconductive die coupled to the second plurality of interconnect pillars; and wherein the first and second semiconductive dice are affixed in a capping material, and wherein the capping material contacts the first- second- and third pluralities of interconnect pillars.

In Example 19, the subject matter of Example 18 optionally includes wherein the interconnect package is a first interconnect package, further including: a second interconnect package including a die side and a land side that are substantially coplanar with the first interconnect package die side and land side; a fourth plurality of interconnect pillars disposed on the second interconnect package at the die side, wherein the second- and fourth pluralities of interconnect pillars are coupled to the second semiconductive die, and wherein the capping material contacts the fourth plurality of interconnect pillars.

In Example 20, the subject matter of any one or more of Examples 18-19 optionally include a passive device coupled to the semiconductive bridge at a fifth plurality of interconnect pillars that are disposed between the first- and second pluralities of interconnect pillars.

Example 21 is a method of assembling a bridge-containing a system-in-package (SiP) apparatus, comprising: attaching a semiconductive bridge and an interconnect package to a release layer, wherein the semiconductive bridge includes an active surface and a backside surface; affixing the semiconductive bridge and the interconnect package in a mass; removing the release layer; assembling first- and second pluralities of interconnect pillars to the semiconductive bridge; assembling a third plurality of interconnect pillars to the interconnect package; coupling a logic die to first- and third pluralities of interconnect pillars; and affixing the logic die and the pluralities of interconnect pillars in a capping material, wherein the capping material contacts the semiconductive bridge active surface.

In Example 22, the subject matter of Example 21 optionally includes wherein the interconnect package is a first interconnect package, further including: attaching a second interconnect package to the release layer; affixing the second interconnect package in the mass; assembling a fourth plurality of interconnect pillars to the second interconnect package; coupling a memory die to second- and fourth pluralities of interconnect pillars; and affixing the memory die and the pluralities of interconnect pillars in the capping material.

In Example 23, the subject matter of Example 22 optionally includes wherein the semiconductive bridge is a first semiconductive bridge, the method further including: attaching a third interconnect package and a second semiconductive bridge to the release layer; affixing the third interconnect package and the second semiconductive bridge in the mass; coupling a user interface to the third interconnect package and the second semiconductive bridge; and affixing the user interface in the capping material.

In Example 24, the subject matter of Example 23 optionally includes assembling an electrical bump array to the first- second and third interconnect packages at the land side; and assembling a board to the electrical bump array.

In Example 25, the subject matter of any one or more of Examples 21-24 optionally include assembling an electrical bump array to the interconnect package at the land side; and assembling a board to the electrical bump array.

Example 26 is a computing system containing a system-in-package (SiP) apparatus, comprising: a semiconductive bridge fixed in a mass, the semiconductive bridge including an active surface and a backside surface, and the mass including a die side and a land side; first- and second pluralities of interconnect pillars extending from the active surface; a first interconnect package fixed in the mass, wherein the first interconnect package communicates from the die side to the land side; a third plurality of interconnect pillars disposed on the interconnect package at the die side; a second interconnect package fixed in the mass, wherein the second interconnect package communicates from the die side to the land side; a fourth plurality of interconnect pillars disposed on the second interconnect package at the die side; a first semiconductive die coupled to the first- and third pluralities of interconnect pillars; a second semiconductive die coupled to the second- and fourth plurality of interconnect pillars; wherein the first and second semiconductive dice are affixed in a capping material, and wherein the capping material contacts the first- second- and third pluralities of interconnect pillars; an electrical bump array coupled to the first- and second interconnect packages at the land side; and a board coupled to the electrical bump array, wherein the board includes an outer shell that provides electrical insulation to the SiP apparatus.

In Example 27, the subject matter of Example 26 optionally includes a second semiconductive bridge fixed in the mass; a third interconnect package fixed in the mass, wherein the third interconnect package is exposed as both the die side and the land side; and a user interface coupled to the second semiconductive bridge and the third interconnect package.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system-in-package apparatus, comprising:
   a semiconductive bridge in a molding compound, the semiconductive bridge having a top surface, a bottommost surface, a first side between the top surface and the bottommost surface, and a second side between the top surface and the bottommost surface, wherein the bottommost surface of the semiconductive bridge is at a same level as a bottommost surface of the molding compound;
   a first interconnect and a second interconnect laterally adjacent to the first side of the semiconductive bridge;
   a third interconnect and a fourth interconnect laterally adjacent to the second side of the semiconductive bridge;
   a first IC device electrically coupled to the top surface of the semiconductive bridge, and the first IC device electrically coupled to the first interconnect and to the second interconnect;
   a second IC device electrically coupled to the top surface of the semiconductive bridge, and the second IC device electrically coupled to the third interconnect and to the fourth interconnect;
   a capping material between and in contact with the first IC device and the second IC device, the capping material between the first IC device and the top surface of the semiconductive bridge, and the capping material between the second IC device and the top surface of the semiconductive bridge;
   a first plurality of bumps beneath the bottommost surface of the semiconductive bridge, the first plurality of bumps within a footprint of the first side and the second side of the semiconductive bridge;
   a second plurality of bumps beneath the first interconnect and the second interconnect; and
   a third plurality of bumps beneath the third interconnect and the fourth interconnect.

2. The system-in-package apparatus of claim 1, further comprising:
   a redistribution layer between the first IC device and the semiconductive bridge and between the second IC device and the semiconductive bridge, and wherein the first IC device and the second IC device are coupled to the semiconductive bridge through the redistribution layer.

3. The system-in-package apparatus of claim 1, further comprising:
   a second bridge in the molding compound, the second bridge laterally adjacent to one of the first plurality of interconnects or the second plurality of interconnects.

4. The system-in-package apparatus of claim 3, further comprising:
   a third IC device coupled to the second bridge, wherein the second bridge couples the second IC device to the third IC device.

5. The system-in-package apparatus of claim 1, further comprising:
   a third device coupled to the semiconductive bridge.

6. The system-in-package apparatus of claim 5, wherein the third device is between the first IC device and the second IC device.

7. The system-in-package apparatus of claim 5, wherein the third device is a passive device.

8. The system-in-package apparatus of claim 1, wherein the first interconnect and the second interconnect are spaced at a pitch greater than a pitch of contacts coupling the first IC device to the first interconnect and the second interconnect.

9. The system-in-package apparatus of claim 1, wherein the first interconnect and the second interconnect are in a first laminate package, and the third interconnect and the fourth interconnect are in a second laminate package.

10. The system-in-package apparatus of claim 1, wherein the semiconductor bridge comprises a plurality of through vias therein.

* * * * *